(12) United States Patent
Kim et al.

(10) Patent No.: US 11,536,980 B2
(45) Date of Patent: Dec. 27, 2022

(54) BEAM STEERING APPARATUS AND SYSTEM HAVING THE SAME

(71) Applicant: SAMSUNG ELECTRONICS CO., LTD., Suwon-si (KR)

(72) Inventors: Sunil Kim, Osan-si (KR); Junghyun Park, Seoul (KR); Duhyun Lee, Yongin-si (KR); Byunggil Jeong, Anyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 234 days.

(21) Appl. No.: 17/089,261

(22) Filed: Nov. 4, 2020

(65) Prior Publication Data
US 2021/0255468 A1    Aug. 19, 2021

(30) Foreign Application Priority Data
Feb. 13, 2020 (KR) .......................... 10-2020-0017776

(51) Int. Cl.
*G02B 27/09* (2006.01)
*H01L 27/146* (2006.01)
*G01S 7/481* (2006.01)
*G01S 7/4914* (2020.01)

(52) U.S. Cl.
CPC .......... *G02B 27/0977* (2013.01); *G01S 7/481* (2013.01); *G01S 7/4914* (2013.01); *H01L 27/14629* (2013.01); *H01L 27/14636* (2013.01)

(58) Field of Classification Search
CPC .. G02B 27/0977; G02B 5/1861; G02B 26/06; G02B 26/101; G02B 17/0864; G01S 7/481; G01S 7/4914; G01S 7/4817; H01L 27/14629; H01L 27/14636; H01L 27/14601
See application file for complete search history.

(56) References Cited

U.S. PATENT DOCUMENTS

| 7,537,512 | B2 | 5/2009 | Seo |
| 10,274,756 | B2 | 4/2019 | Kim et al. |
| 2012/0243828 | A1* | 9/2012 | Suzuki ............... G02B 6/12007 385/32 |
| 2018/0136537 | A1 | 5/2018 | Kim et al. |

(Continued)

FOREIGN PATENT DOCUMENTS

KR    10-2006-0045803 A    5/2006

*Primary Examiner* — Tony Ko
(74) *Attorney, Agent, or Firm* — Sughrue Mion, PLLC

(57) ABSTRACT

Provided is a beam steering apparatus including a driving pixel unit including a plurality of driving pixels that are respectively configured to supply a voltage or a current, a light modulator including a plurality of pixels corresponding to the plurality of driving pixels, each pixel of the plurality of pixels being configured to modulate incident light, and a wiring layer including a wiring structure configured to electrically connect the plurality of driving pixels to the plurality of pixels, wherein the wiring structure includes a first conductive wire connected to the plurality of driving pixels, a second conductive wire connected to the plurality of pixels, and at least one third conductive wire connected between the first conductive wire and the second conductive wire, and wherein the first conductive wire, the second conductive wire, and the at least one third conductive wire form a step structure.

20 Claims, 9 Drawing Sheets

(56) References Cited

U.S. PATENT DOCUMENTS

| | | |
|---|---|---|
| 2019/0018299 A1 | 1/2019 | Park et al. |
| 2020/0192039 A1* | 6/2020 | Nakashiba ............... G02B 6/13 |
| 2021/0165160 A1* | 6/2021 | Iida ......................... G02B 6/13 |
| 2021/0240052 A1* | 8/2021 | Uenoyama ................ G02F 1/01 |
| 2021/0302801 A1* | 9/2021 | Kuwajima .............. G02F 1/025 |

* cited by examiner

BEAM STEERING APPARATUS AND SYSTEM HAVING THE SAME

CROSS-REFERENCE TO RELATED APPLICATION

This application claims priority from Korean Patent Application No. 10-2020-0017776, filed on Feb. 13, 2020 in the Korean Intellectual Property Office, the disclosure of which is incorporated herein in its entirety by reference.

BACKGROUND

1. Field

Example embodiments of the present disclosure relate to beam steering apparatuses with an improved wiring structure and a system including the same.

2. Description of Related Art

An advanced driving assistance system (ADAS) with various functions is being commercialized. For example, vehicles equipped with functions are increasing, for example, an adaptive cruise control (ACC) in which a vehicle reduces speed if there is a risk of collision by recognizing the location and speed of another vehicle and if there is no risk of collision, the vehicle runs within a set speed range, and an autonomous emergency braking (AEB) system that prevents collision by automatically applying a brake when there is a risk of collision by recognizing a vehicle ahead but the driver does not respond or the responding method is not appropriate. Also, automobiles capable of autonomous driving are expected to be commercialized in the near future.

Accordingly, interest in a light measuring device capable of providing information around a vehicle is increasing. For example, a light detection and ranging (LiDAR) device for a vehicle may provide information about a distance, relative speed, and azimuth to an object around the vehicle by detecting a reflected laser after irradiating a laser to a selected area around the vehicle. To this end, the LiDAR device for a vehicle includes a beam steering apparatus capable of steering light in a desired area.

The beam steering apparatus may be largely classified into a mechanical beam steering apparatus and a non-mechanical beam steering apparatus. For example, the mechanical beam steering apparatus includes a method of rotating a light source itself, a method of rotating a mirror that reflects light, a method of moving a spherical lens in a direction perpendicular to the optical axis, etc. In addition, the non-mechanical beam steering apparatus includes a method using a semiconductor device and a method of electrically controlling an angle of reflected light by using a reflective phase array.

SUMMARY

One or more example embodiments provide beam steering apparatuses having an improved wiring structure.

One or more example embodiments also provide systems including a beam steering apparatus having an improved wiring structure.

Additional aspects will be set forth in part in the description which follows and, in part, will be apparent from the description, or may be learned by practice of example embodiments.

According to an aspect of an example embodiment, there is provided a beam steering apparatus including a driving pixel unit including a plurality of driving pixels that are respectively configured to supply a voltage or a current, a light modulator including a plurality of pixels corresponding to the plurality of driving pixels, each pixel of the plurality of pixels being configured to modulate incident light, and a wiring layer including a wiring structure configured to electrically connect the plurality of driving pixels to the plurality of pixels, wherein the wiring structure includes a first conductive wire connected to the plurality of driving pixels, a second conductive wire connected to the plurality of pixels, and at least one third conductive wire connected between the first conductive wire and the second conductive wire, and wherein the first conductive wire, the second conductive wire, and the at least one third conductive wire form a step structure.

The wiring layer may include a plurality of layers.

A size of each driving pixel of the plurality of driving pixels may be different from a size of each pixel of the plurality of pixels.

A size of each driving pixel of the plurality of driving pixels may be greater than a size of each pixel of the plurality of pixels.

The light modulator may include a distributed Bragg reflector, a grating reflector, and a cavity provided between the distributed Bragg reflector and the grating reflector.

The grating reflector may include Si.

A refractive index of the grating reflector may change based on heat or a voltage applied to the grating reflector.

The first conductive wire, the second conductive wire, and the at least one third conductive wire may include at least one of aluminum (Al), copper (Cu), and tungsten (W).

The light modulator may include a mirror layer, a refractive index conversion layer, and a nano-antenna.

The refractive index conversion layer may include at least one of indium tin oxide (ITO), indium zinc oxide (IZO), AZO, gallium zinc oxide (GZO), and gallium indium zinc oxide (GIZO).

According to another aspect of an example embodiment, there is provided a system including a light source configured to emit light, a beam steering apparatus configured to transmit light to an object by controlling a traveling direction of the light emitted from the light source, a photodetector configured to detect light reflected from the object, and a controller configured to control the beam steering apparatus, wherein the beam steering apparatus includes a driving pixel unit including a plurality of driving pixels that are respectively configured to supply a voltage or a current, a light modulator including a plurality of pixels corresponding to the plurality of driving pixels, respectively, each pixel of the plurality of pixels being configured to modulate incident light, and a wiring layer including a wiring structure that electrically connects the plurality of driving pixels and the plurality of pixels, wherein the wiring structure includes a first conductive wire connected to the plurality of driving pixels, a second conductive wire connected to the plurality of pixels, and at least one third conductive wire connected between the first conductive wire and the second conductive wire, and wherein the first conductive wire, the second conductive wire, and the at least one third conductive wire form a step structure.

The wiring layer may include a plurality of layers.

A size of each driving pixel of the plurality of driving pixels may be different from a size of each pixel of the plurality of pixels.

A size of each driving pixel of the plurality of driving pixels may be greater than a size of each pixel of the plurality of pixels.

The light modulator may include a distributed Bragg reflector, a grating reflector, and a cavity provided between the distributed Bragg reflector and the grating reflector.

The grating reflector may include Si.

A refractive index of the grating reflector may change based on heat or a voltage being applied to the grating reflector.

The first conductive wire, the second conductive wire, and the at least one third conductive wire may include at least one of aluminum (Al), copper (Cu), and tungsten (W).

The light modulator may include a mirror layer, a refractive index conversion layer, and a nano-antenna.

The refractive index conversion layer may include at least one of indium tin oxide (ITO), indium zinc oxide (IZO), AZO, gallium zinc oxide (GZO), and gallium indium zinc oxide (GIZO)

BRIEF DESCRIPTION OF THE DRAWINGS

The above and/or other aspects, features, and advantages of certain example embodiments of the disclosure will be more apparent from the following description taken in conjunction with the accompanying drawings, in which.

DETAILED DESCRIPTION

Figure 1:
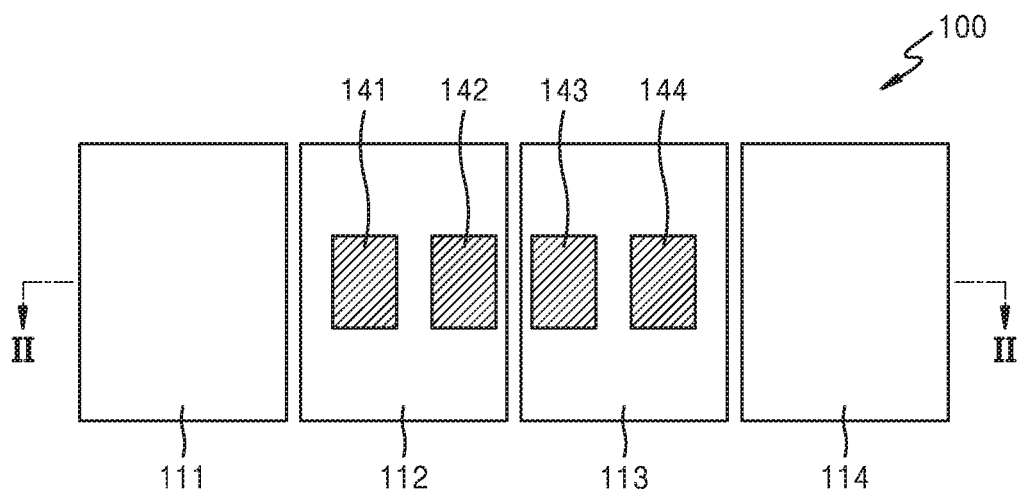
FIG. 1 is a plan view of a beam steering apparatus according to an example embodiment.

Reference will now be made in detail to example embodiments of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Hereinafter, light modulators and beam steering apparatuses including the same will be described in detail with reference to the accompanying drawings. In the drawings, like reference numerals refer to like elements, and size of each constituting element may be exaggerated for clarity of descriptions and convenience of explanation. Although the terms 'first', 'second', etc. may be used herein to describe various constituent elements, these constituent elements should not be limited by these terms. The terms are only used to distinguish one constituent element from another.

Singular forms are intended to include the plural forms as well, unless the context clearly indicates otherwise. When a part "comprises" or "includes" an element in the specification, unless otherwise defined, other elements are not excluded from the part and the part may further include other elements In the drawings, size and thickness of each constituting element may be exaggerated for clarity of explanation. Also, when it is described that a predetermined material layer is present on a substrate or other layer, the material layer may exist in direct contact with the substrate or other layer, and another third layer may exist therebetween. In addition, in the examples below, materials for forming each layer are exemplary, and other materials may be used.

Also, in the specification, the term "units" or " . . . modules" denote units or modules that process at least one function or operation, and may be realized by hardware, software, or a combination of hardware and software.

Specific executions described in the present disclosure are example embodiments and are not limiting. For conciseness of the specification, disclosure of conventional electronic configurations, control systems, software, and other functional aspects of the systems may be omitted. In addition, connections or connection members of lines between components shown in the drawings illustrate functional connections and/or physical or circuit connections, and the connections or connection members can be represented by replaceable or additional various functional connections, physical connections, or circuit connections in an actual apparatus.

The term "above" and similar directional terms may be applied to both singular and plural.

With respect to operations that constitute a method, the operations may be performed in any appropriate sequence unless the sequence of operations is clearly described. Also, all example terms (for example, etc.) are simply used to explain in detail the present disclosure, and thus, are not limiting.

Figure 2:
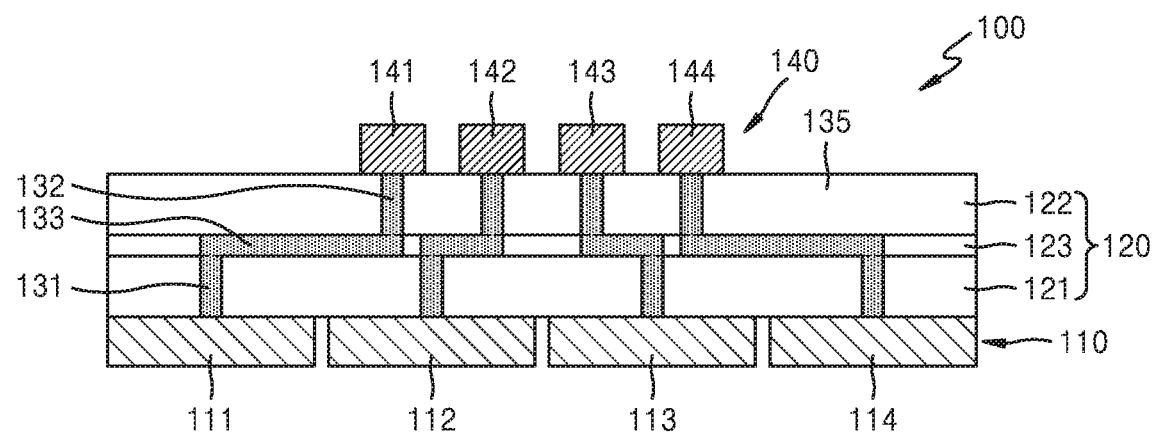
FIG. 2 is a cross-sectional view taken along line II-II of FIG. 1.

FIG. 1 is a plan view of a beam steering apparatus according to an example embodiment. FIG. 2 is a cross-sectional view taken along line II-II of FIG. 1.

Referring to FIGS. 1 and 2, a beam steering apparatus 100 includes a driving pixel unit 110 including a plurality of driving pixels, a light modulator 140 including a plurality of pixels corresponding to the plurality of driving pixels, and a wiring layer 120 having a wiring structure to electrically connect the driving pixel unit 110 to the light modulator 140.

The driving pixel unit 110 may supply a voltage or current to the light modulator 140. The driving pixel unit 110 may include, for example, a first driving pixel 111, a second driving pixel 112, a third driving pixel 113, and a fourth driving pixel 114. The driving pixels may include, for example, a transistor and a capacitor to independently apply a required voltage or current to the pixels of the light modulator 140. The transistor may act as a switching element, and the capacitor may accumulate an amount of charge. The transistor may apply a voltage required to each pixel through an on-off switching operation, and the capacitor may accumulate an amount of charge required for each pixel and supply the accumulated charge to the light modulator 140.

Each of the plurality of pixels of the light modulator 140 may modulate light. The light modulator 140 may modulate, for example, at least one of a phase of light and an intensity of light. The light modulator 140 may control a travelling direction of light by modulating at least one of phase and intensity of light required for each pixel by a voltage or current supplied from the driving pixel unit 110. The light modulator 140 may include a number of pixels corresponding to the number of driving pixels of the driving pixel unit 110. The light modulator 140 may include, for example, a first pixel 141, a second pixel 142, a third pixel 143, and a fourth pixel 144. The pixel may be a unit capable of independently driving the light modulator 140. Alternatively, the pixel may represent a basic unit capable of independently modulating a phase of light.

The plurality of driving pixels and the plurality of pixels may correspond 1:1. The plurality of driving pixels and the plurality of pixels may be electrically connected by a wiring structure. The first driving pixel 111 may be connected to the first pixel 141, the second driving pixel 112 may be connected to the second pixel 142, the third driving pixel 113 may be the third pixel 143, and the fourth driving pixel 114 may be connected to the fourth pixel 144.

The wiring layer 120 may include, for example, a first conductive wire 131 connected to the plurality of driving pixels, a second conductive wire 132 connected to the plurality of pixels, and at least one third conductive wire 133 connected between the first conductive wire 131 and the second conductive wire 132. The first conductive wire 131, the second conductive wire 132, and the third conductive wire 133 may have a step structure. The first conductive wire 131, the second conductive wire 132, and the third conductive wire 133 may include a conductive material. The first conductive wire 131, the second conductive wire 132, and the third conductive wire 133 may include, for example, at least one of aluminum (Al), copper (Cu), and tungsten (W). However, the material of the conductive wire is not limited thereto. In FIG. 2, the third conductive wires 133 are depicted as being provided in one layer as an example. However, the third conductive wires 133 are not limited thereto and may be implemented as conductive wires provided in two or more layers.

The wiring layer 120 may include a plurality of layers. Each layer may have a different wiring structure. For example, the wiring layer 120 may include a first layer 121 including the first conductive wires 131, a second layer 122 including the second conductive wires 132, and a third layer 123 including the third conductive wires 133. For example, the first layer 121 may have a wiring structure including the first conductive wire 131, the second layer 122 may have a wiring structure including the second conductive wire 132, and the third layer 123 may have a wiring structure including the third conductive wire 133. The thickness of each layer may be the same. However, the thickness of each layer may be configured differently from each other.

The wiring layer 120 may include an insulating material 135 around the conductive wires. The insulating material 135 may include, for example, silicon oxide ($SiO_2$) or aluminum oxide ($Al_2O_3$). However, the insulating material 135 is not limited thereto.

The first conductive wires 131 may be vertical conductive wires respectively connected to the driving pixels, and the second conductive wires 132 may be vertical conductive wires respectively connected to the pixels. The third conductive wires 133 may be horizontal conductive wires connecting the first conductive wires 131 to the second conductive wires 132. Here, the vertical conductive wires may represent conductive wires extending in a direction perpendicular to the driving pixel unit 110, and the horizontal conductive wires may indicate conductive wires extending in a horizontal direction with respect to the driving pixel unit 110. In other words, the vertical conductive wires represent conductive wires arranged so that a current flows in a direction perpendicular to the driving pixel unit 110, and the horizontal conductive wires represent conductive wires arranged so that a current flows in a direction horizontal to the driving pixel unit 110. In FIG. 2, the third conductive wires 133 is configured as horizontal conductive wires. In FIG. 2, although the third conductive wire 133 is illustrated as one conductive wire, the third conductive wire 133 may also be configured to include at least one horizontal conductive wire and at least one vertical conductive wire.

Sizes of the driving pixel and the pixel may be different from each other. For example, the size of the driving pixel may be greater than that of the pixel. Alternatively, the size of the driving pixel may be less than that of the pixel. Here, the size may indicate a horizontal width. In FIG. 2, it is depicted that the size of the driving pixel is greater than that of the pixel. In addition, a total area of the light modulator 140 may be less than that of the driving pixel unit 110 by reducing a distance between the pixels.

For example, as the sizes of the first to fourth pixels 141, 142, 143, and 144 decrease, a wider field of view (FOV) may be obtained, and as the distance between the pixels decreases, reflectivity may be increased. In addition, the larger the size of the first to fourth driving pixels 111, 112, 113, and 114, a higher voltage may be applied and a manufacturing process is advantageous, thereby reducing the manufacturing cost. As described above, when the sizes of the pixel and the driving pixel are different from each other, the pixel and the driving pixel may be more easily electrically connected by using a step wiring structure therebetween. Because the electrical connection between the pixel and the driving pixel is more easily achieved, the degree of freedom in selecting advantageous sizes of the driving pixel and the pixel may be increased.

However embodiments are not limited thereto. For example, the pixel may also have a size greater than that of the driving pixel. In this case, the conductive wires may be arranged by inverting the wiring structure shown in FIG. 2 upside down.

Figure 3:
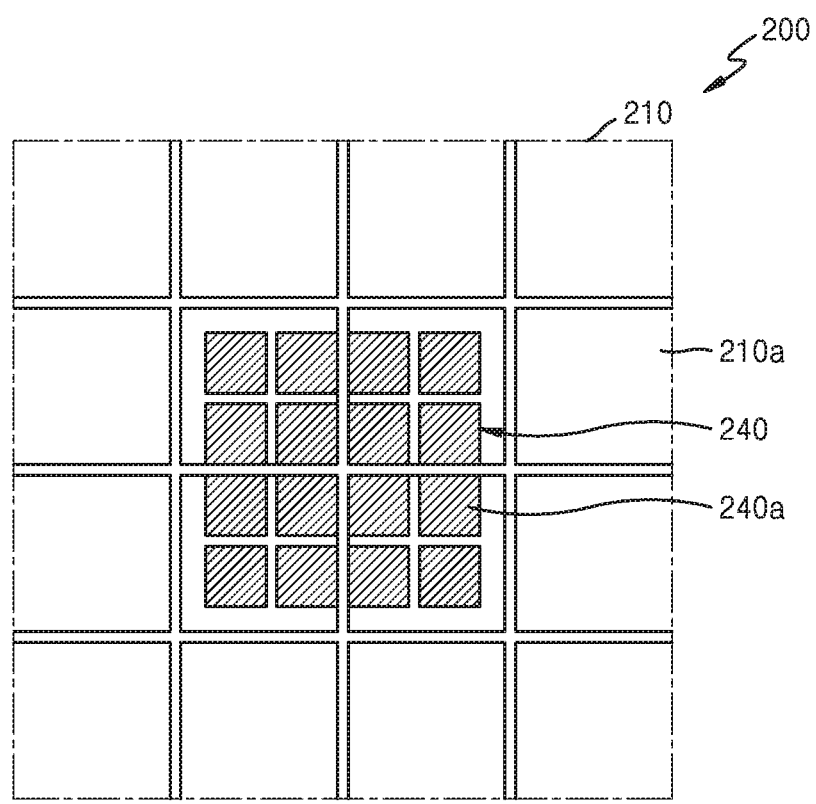
FIG. 3 is a plan view of a beam steering apparatus according to another example embodiment.

FIG. 3 shows an example in which driving pixels and pixels are arranged in a matrix structure according to an example embodiment.

A beam steering apparatus 200 according to another example embodiment may include a driving pixel unit 210 including a plurality of driving pixels 210a and a light modulator 240 including a plurality of pixels 240a. In FIG. 3, a 4×4 matrix structure is illustrated. The driving pixels 210a and the pixels 240a may have different sizes from each other. FIG. 3 shows an example in which the size of the driving pixel 210a is greater than that of the pixel 240a. In addition, the total area of the light modulator 240 may be formed to be less than the total area of the driving pixel unit 210 by reducing a distance between the pixels 240a.

Figure 4:
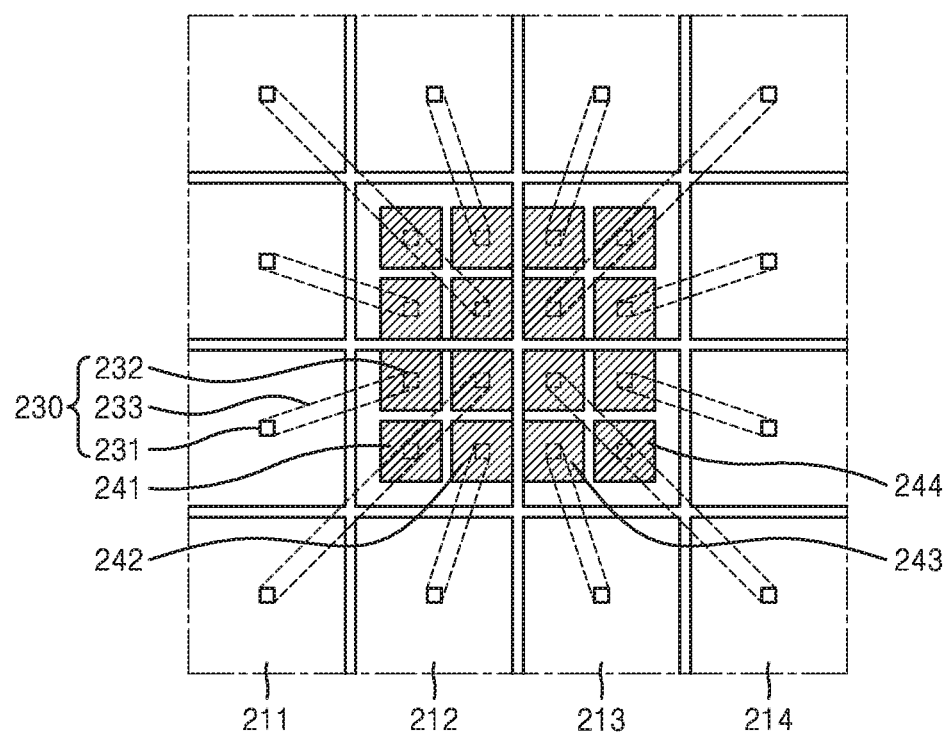
FIG. 4 is a diagram showing a wiring structure of the beam steering apparatus shown in FIG. 3.
Figure 5:
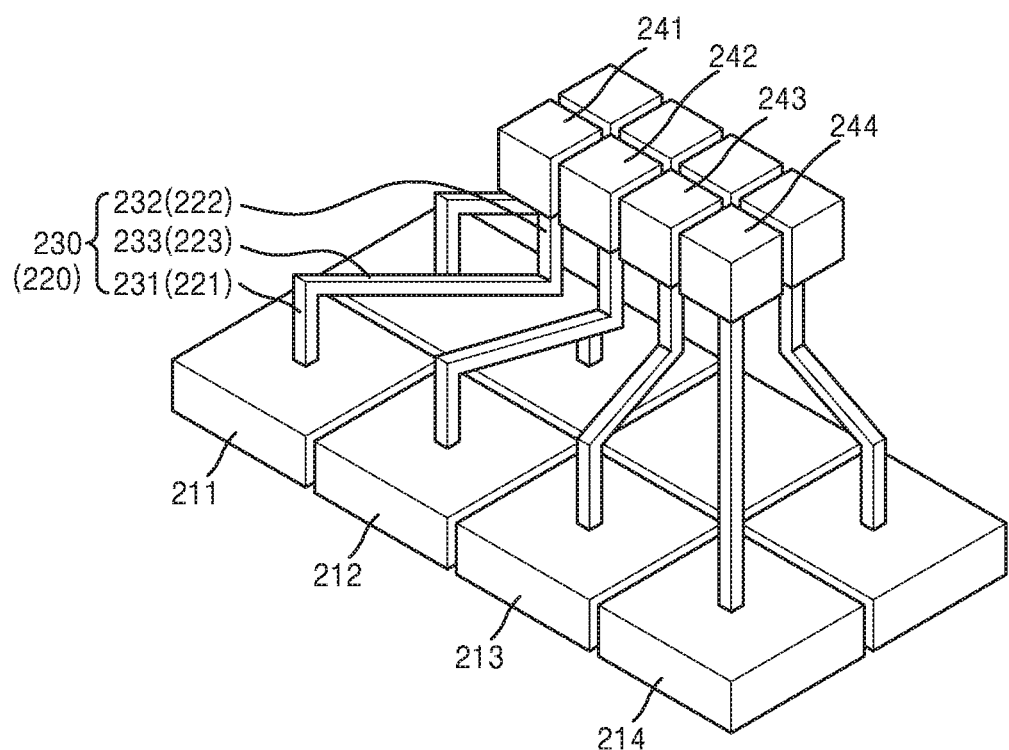
FIG. 5 is a partial perspective view of the beam steering apparatus shown in FIG. 4.

FIG. 4 shows a plan view of the beam steering apparatus 200, and FIG. 5 shows a partial perspective view of the beam steering apparatus 200.

The driving pixel unit 210 may include, for example, a first driving pixel 211, a second driving pixel 212, a third driving pixel 213, and a fourth driving pixel 214, and the light modulator 240 may include, for example, a first pixel 241, a second pixel 242, a third pixel 243, and a fourth pixel 244. A wiring layer 230 may be provided between the driving pixel unit 210 and the light modulator 240. The wiring layer 230 may have a wiring structure for electrical connection between the driving pixel unit 210 and the light modulator 240.

The first driving pixel 211 may be electrically connected to the first pixel 241, the second driving pixel 212 may be electrically connected to the second pixel 242, and the third driving pixel 213 may be electrically connected to the third pixel 243, and the fourth driving pixel 214 may be electrically connected to the fourth pixel 244. In other words, in the matrix structure, the driving pixel in a first line and the corresponding pixel in the first line may be electrically connected by a conductive wire having a step structure, and the driving pixel in a second line and the corresponding pixel in the second line may be electrically connected by a conductive wire having a step structure.

The wiring layer 230 may include, for example, a first conductive wire 231 connected to the plurality of driving pixels, a second conductive wire 232 connected to the plurality of pixels, and a third conductive wire connected 233 between the first conductive wire 231 and the second conductive wire 232. The first conductive wire 231, the second conductive wire 232, and the third conductive wire 233 may have a step structure. In this manner, a wiring structure may be provided between the driving pixels and the pixels in different lines. For example, when comparing the wiring structure connected between the driving pixel in the first line and the pixel in the first line and the wiring structure connected between the driving pixel in the second line and the pixel in the second line, lengths of the first conductive wire 231 and the second conductive wire 232 are the same, and the direction and length of the third conductive wire 233 may be different according to a distance between the driving pixel and the pixel. In other words, the direction and length of the third conductive wire 233 may be changed according to the distance and direction between the corresponding driving pixel and the pixel. As described above, in a matrix structure in which sizes of driving pixels and pixels are different, the driving pixels and pixels may be readily electrically connected by arranging the first conductive wire, the second conductive wire, and the third conductive wire in a stepwise manner. In the drawing, although it is depicted that the conductive wires have a rectangular cross-section, this is an example, and it is also possible to have various cross-sections, for example, a circular cross-section.

Referring to FIG. 5, the wiring layer 220 may include a plurality of layers. Each layer may have a different wiring structure. For example, the wiring layer 220 may include a first layer 221 including the first conductive wire 231, a second layer 222 including the second conductive wire 232, and a third layer 223 including the third conductive wire 233. In the drawing, as an example, the first layer 221, the second layer 222, and the third layer 223 are shown in parallel with the first conductive wire 231, the second conductive wire 232, and the third conductive wire 233.

The first layer 221 may have a wiring structure including the first conductive wire 231, the second layer 222 may have a wiring structure including the second conductive wire 232, and the third layer 223 may have a wiring structure including the third conductive wire 233, The wiring layer 220 may include an insulating material around the conductive wire.

Figure 6:
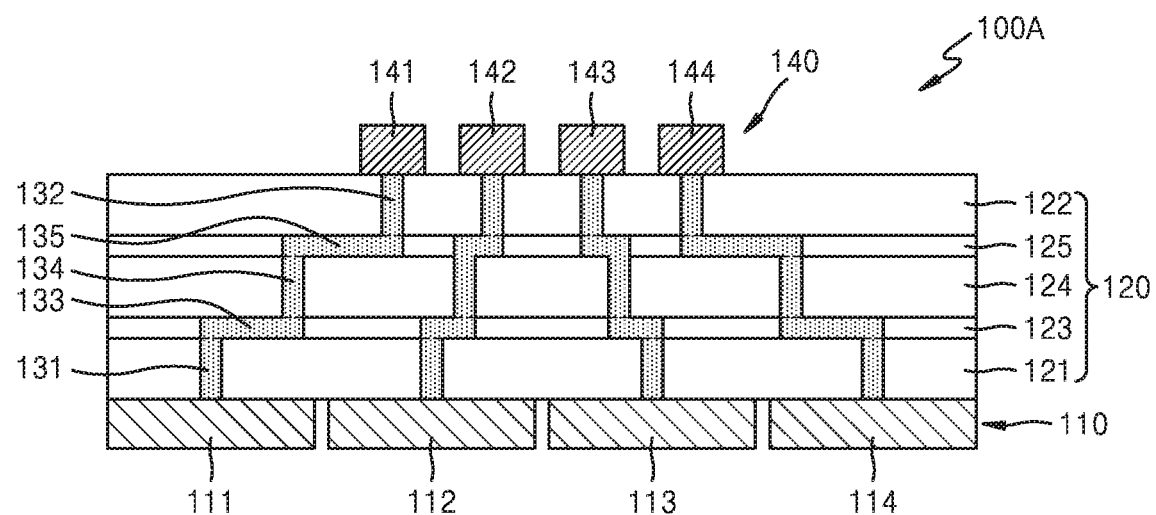
FIG. 6 is a cross-sectional view of a beam steering apparatus according to another example embodiment.

FIG. 6 shows a beam steering apparatus 100A according to another example embodiment.

When the beam steering apparatus 100A is compared with the beam steering apparatus 100 of FIG. 2, the wiring layer 120 is different in that the wiring layer 120 includes five layers.

The wiring layer 120 may include a first layer 121, a second layer 122, a third layer 123, a fourth layer 124, and a fifth layer 125. The first layer 121 may have a first wiring structure including a first conductive wire 131, the second layer 122 may have a second wiring structure including a second conductive wire 132, the third layer 123 may have a third wiring structure including a third conductive wire 133, the fourth layer 124 may have a fourth wiring structure including a fourth conductive wire 134, and the fifth layer 125 may have a fifth wiring structure including a fifth conductive wire 135. The first conductive wire 131 may be connected to the first to fourth driving pixels 111, 112, 113, and 114, and the second conductive wire 132 may be connected to the first to fourth pixels 141, 142, 143, and 144. At least one conductive wire may be provided between the first conductive wire 131 and the second conductive wire 132. For example, a third conductive wire 133, a fourth conductive wire 134, and a fifth conductive wire 135 may be provided between the first conductive wire 131 and the second conductive wire 132. The third conductive wire 133, the fourth conductive wire 134, and the fifth conductive wire 135 may be connected in a stepwise manner between the first conductive wire 131 and the second conductive wire 132.

The first conductive wire 131, the second conductive wire 132, and the fourth conductive wire 134 may be vertical conductive wires. The third conductive wire 133 and the fifth conductive wire 135 may be horizontal conductive wires. Here, the vertical conductive wire may indicate a conductive wire in which a current flows in the vertical direction with respect to the pixel, and the horizontal conductive wire may indicate a conductive wire in which a current flows in the horizontal direction with respect to the pixel.

In the example embodiment, it shows that the wiring structure may be variously changed according to the arrangement of the driving pixels and the pixels.

Figure 7:
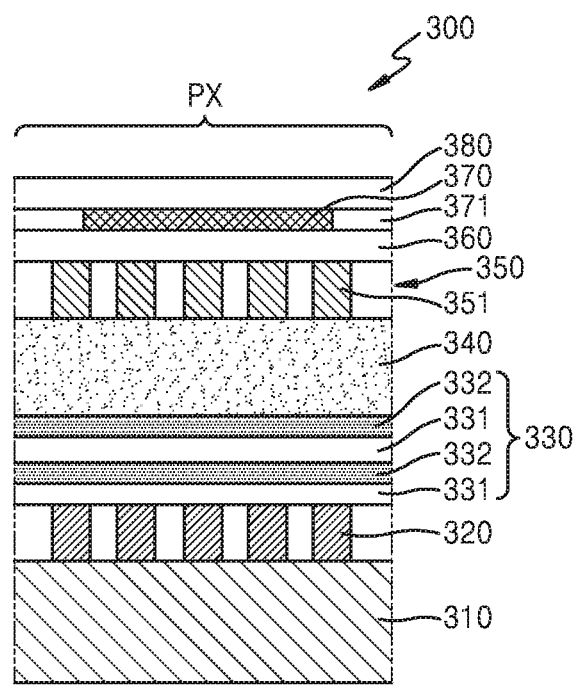
FIG. 7 is a diagram showing an example of a light modulator of a beam steering apparatus according to an example embodiment.

FIG. 7 shows a light modulator 300 according to an example embodiment.

The light modulator 300 may include a substrate 310, a distributed Bragg reflector 330 on the substrate 310, a cavity 340 on the distributed Bragg reflector 330, a grating reflector 350 on the cavity 340, and a heater 370 on the grating reflector 350. The light modulator 300 may modulate and output at least one of a phase and intensity of incident light. The light modulator 300 may include a plurality of pixels PX. The pixel PX may be a unit capable of independently driving the light modulator 300. Alternatively, the pixel PX may represent a basic unit capable of independently modulating a phase of light.

The substrate 310 may be transparent to transmit light. For example, the substrate 310 may include a silicon substrate or a glass substrate. However, the substrate 310 is not limited thereto.

The distributed Bragg reflector 330 may be configured by alternately stacking multiple times a first layer 331 and a second layer 332 having different refractive indices from each other. All waves reflected at an interface of each layer may be interfered due to the difference in refractive index. The distributed Bragg reflector 330 may have a structure in which layers including two of silicon (Si), $Si_3N_4$, $SiO_2$, and titanium oxide ($TiO_2$) are alternately stacked. The distributed Bragg reflector 330 may have, for example, a structure in which $Si_3N_4$ layers and $SiO_2$ layers are alternately stacked. The light reflectance may be controlled by a thickness and the number of layers of the two layers of the distributed Bragg reflector 330.

The cavity 340 may include, for example, $SiO_2$. The resonance wavelength may be determined according to the thickness of the cavity 340. The thicker the cavity 340, the longer the resonance wavelength of light, and the smaller the cavity 340, the shorter the resonance wavelength of light.

The grating reflector 350 may be formed by arranging gratings 351 spaced apart by predetermined intervals. The reflection and transmission of light may be controlled by controlling the distance, height, and width of the grating 351. The grating 351 may have a refractive index greater than that of a surrounding material. The grating reflector 350 may include silicon Si.

Light of a specific phase may be output while light is repeatedly reflected between the distributed Bragg reflector 330 and the grating reflector 350. A specific phase may be controlled by heat input through the heater 370. Light may be transmitted through the distributed Bragg reflector 330, may be propagated to the cavity 340, may be reflected by the grating reflector 350, and then, may be emitted through the distributed Bragg reflector 330 after being trapped in the cavity 340 and resonated by the distributed Bragg reflector 330 and the grating reflector 350. A refractive index of the grating reflector 350 may be changed by heat applied by the heater 170, and the resonance characteristics of the grating reflector 350 are changed according to the change in the refractive index, and thus, the phase of light emitted to the outside may be controlled. In addition, the reflectance of the grating reflector 350 may be controlled by heat transferred from the heater 370. When the light modulator 300 is coupled to the driving pixel unit 110 (refer to FIGS. 1 and 2), the substrate 310 may be removed.

In the light modulator 300, the heater 370 may be located at the top of the light modulator 300. Because the heater 370 is located at the top of the light modulator 300, heat generated from the heater 370 may be more quickly discharged to the outside. Therefore, the temperature control of the light modulator 300 may be easier, and thus, the driving speed of the light modulator 300 may be increased. In other words, because heat may be quickly discharged to the outside, the temperature of the light modulator 300 may be quickly raised or lowered in units of each pixel PX by the heater 370. In addition, because heat is quickly discharged, the influence of heat on the adjacent pixels PX may be reduced, thereby reducing thermal crosstalk between adjacent pixels. Therefore, the phase modulation is independently performed for each pixel, and thus, the precision of controlling a direction of light travel according to the phase modulation may be increased.

The heater 370 may include, for example, at least one of W, TiN, and nichrome (NiCr). However, the material of the heater 370 is not limited thereto. The heater 370 may be separated in units of pixels PX. A dielectric 371 may be filled between the heater 370 and the another heater 370. The dielectric 371 may include, for example, $SiO_2$. The heater 370 may have a size less than a size of a pixel. The size of the heater 370 may be controlled considering the thermal conductivity of the heater 370 and thermal crosstalk between adjacent pixels. The phase of light may be modulated by applying heat to each pixel PX through the heater 370. The light modulator 300 may control the direction of emitting light by modulating the phase of incident light for each pixel PX.

A spacer layer 360 may further be provided between the heater 370 and the grating reflector 350. The spacer layer 360 may include a dielectric. The spacer layer 360 may include, for example, $SiO_2$. The spacer layer 360 may control the efficiency of heat being applied to the grating reflector 350 from the heater 370. The spacer layer 360 may have a thickness, for example, in the range of about 200 nm to about 1000 nm. When the thickness of the spacer layer 360 is less than 200 nm, the reflectance of the grating reflector 350 is too small, and when the thickness of the spacer layer 160 is greater than 1000 nm, the efficiency of heat transfer may decrease. When the spacer layer 360 has such a thickness, the refractive index of the grating reflector 350 may be appropriately controlled.

A heat sink 380 may further be provided on the heater 370. The heat sink 380 may be a layer that protects the heater 370 while releasing heat from the heater 370. The heat sink 380 may include, for example, $SiO_2$.

A nano-structure 320 may further be provided between the substrate 310 and the distributed Bragg reflector 330.

The nano-structure 320 may include a nano-sized structure. The nano-structure 320 may include, for example, a columnar structure. The nano-structure may be, for example, a cylinder. The nano-structure 320 may include an array of nano-structures in a region corresponding to the pixel PX of the light modulator 300. For example, the nano-structure 320 may have a different nano-structure arrangement for each pixel PX. The nano-structure 320 of a pixel may be configured to be different in at least one of size of a single cylinder, number, shape, and arrangement interval between nano-structures. In the nano-structure 320, the nano-columns may be periodically arranged or aperiodically arranged. The arrangement of the nano-structure 320 may be designed in units of pixels. In other words, the nano-structure 320 may have an arrangement designed for a specific function for each pixel PX. Although in FIG. 7 it is depicted as an example that the nano-structure 320 is provided between the substrate 310 and the distributed Bragg reflector 330, the nano-structure 320 may be provided on the lower surface of the substrate 310. The nano-structure 320 may have a size of a sub-wavelength. The nano-structure 320 may have, for example, a size in a range of about 50 nm to about 1500 nm. The nano-structure 320 may have a size in a range of about 300 nm to about 320 nm, and, for example, an arrangement pitch of the nano-structures 320 may be 710 nm. However, the size of the nano-structure 320 is not limited thereto and may be variously changed.

Figure 8:
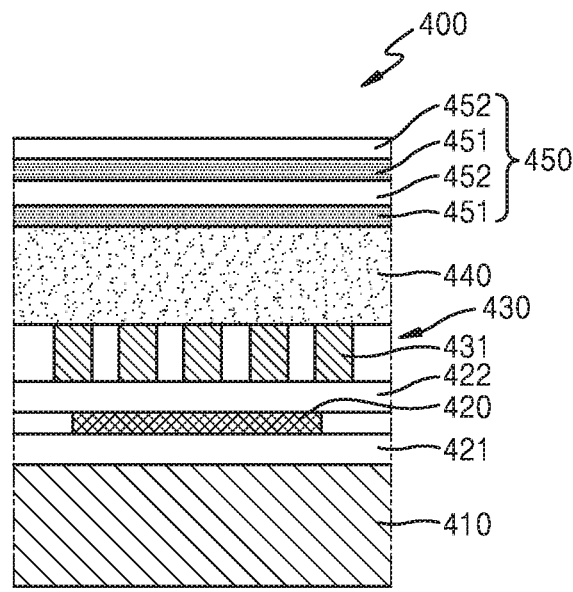
FIG. 8 is a diagram showing an example of a light modulator of a beam steering apparatus according to an example embodiment.

FIG. 8 shows another example of a light modulator 400 according to an example embodiment.

The light modulator 400 may include a substrate 410, a grating reflector 430 on the substrate 410, a cavity 440 on the grating reflector 430, and a distributed Bragg reflector 450 on the cavity 440. In addition, a heater 420 may be included between the substrate 410 and the grating reflector 430.

In the grating reflector 430, gratings 431 separated at predetermined intervals from each other may be arranged. Light reflection and transmission may be controlled by controlling the distance, height, and width of the gratings 431.

The distributed Bragg reflector 450 may be configured by alternately stacking multiple times a first layer 451 and a second layer 452 having different refractive indices from each other.

A refractive index of the grating reflector 430 may be changed by heat applied by the heater 420, and the resonance characteristics of the grating reflector 430 are changed according to the change in the refractive index, and thus, the phase of light emitted to the outside may be controlled.

A spacer layer 422 may further be provided between the heater 420 and the grating reflector 430. The spacer layer 422 may include a dielectric.

A dielectric layer 421 may further be provided between the substrate 410 and the heater 420. The dielectric layer 421 may function as a heat sink. When the light modulator 400 is coupled to the driving pixel unit 110 (refer to FIGS. 1 and 2), the substrate 410 may be removed.

Figure 9:
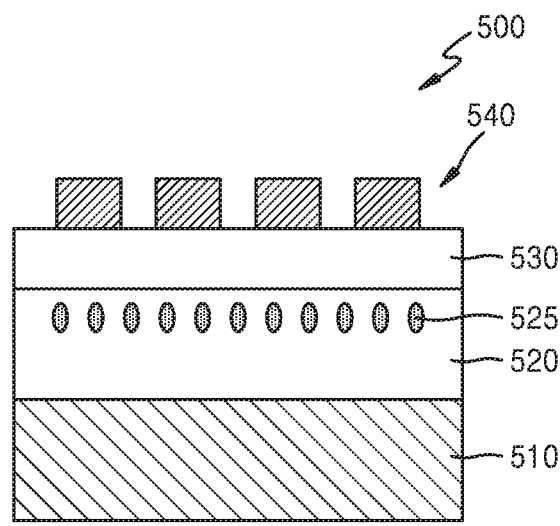
FIG. 9 is a diagram showing an example of a light modulator of a beam steering apparatus according to an example embodiment.

FIG. 9 shows another example of a light modulator 500 according to an example embodiment.

The light modulator 500 may include a mirror layer 510, a refractive index conversion layer 520 on the mirror layer 510, and a nano-antenna 540 above the refractive index conversion layer 520.

The mirror layer 510 may include, for example, a metal material having high reflectance. The mirror layer 510 may include, for example, gold (Au). The refractive index conversion layer 520 may include an oxide semiconductor. The refractive index conversion layer 520 may include, for example, at least one of indium tin oxide (ITO), indium zinc oxide (IZO), AZO, gallium zinc oxide (GZO), and gallium indium zinc oxide (GIZO). When a voltage is applied to the refractive index conversion layer 520, the charge density of the refractive index conversion layer 520 may be changed, and as a result, the refractive index may be changed. Reference numeral 525 denotes an electric charge.

An insulating layer 530 may be provided between the refractive index conversion layer 520 and the nano-antenna 540. The insulating layer 530 may include, for example, at least one of SiNx, SiOx, $Al_2O_3$, and hafnium oxide ($HfO_2$).

Light of a specific phase may be output as light is repeatedly reflected between the mirror layer 510 and the nano-antenna 540. A phase may be controlled by a voltage applied to the refractive index conversion layer 520.

The beam steering apparatuses according to various example embodiments may control a travelling direction of emitting light through phase modulation of independent light of a pixel and synthesis of phase-modulated light. When the light modulator is arranged in the form of a matrix, the traveling direction of light may be controlled in a horizontal direction and a vertical direction, and thus, light may be stereoscopically scanned.

The beam steering apparatuses according to various example embodiments described above may be employed in a system, for example, a three-dimensional (3D) sensor, such as a LiDAR device for vehicles or a depth sensor used in a 3D camera to increase precision.

The system according to various example embodiments, in addition to a LiDAR device for vehicles, may be used in a LiDAR device for robots, a LiDAR device for drones, an intruder detection system for security, a screen door obstacle detection system for subways, a depth sensor, a user face recognition sensor in a mobile phone, and augmented reality (AR), motion recognition and object profiling in televisions (TVs) or entertainment equipment.

Figure 10:
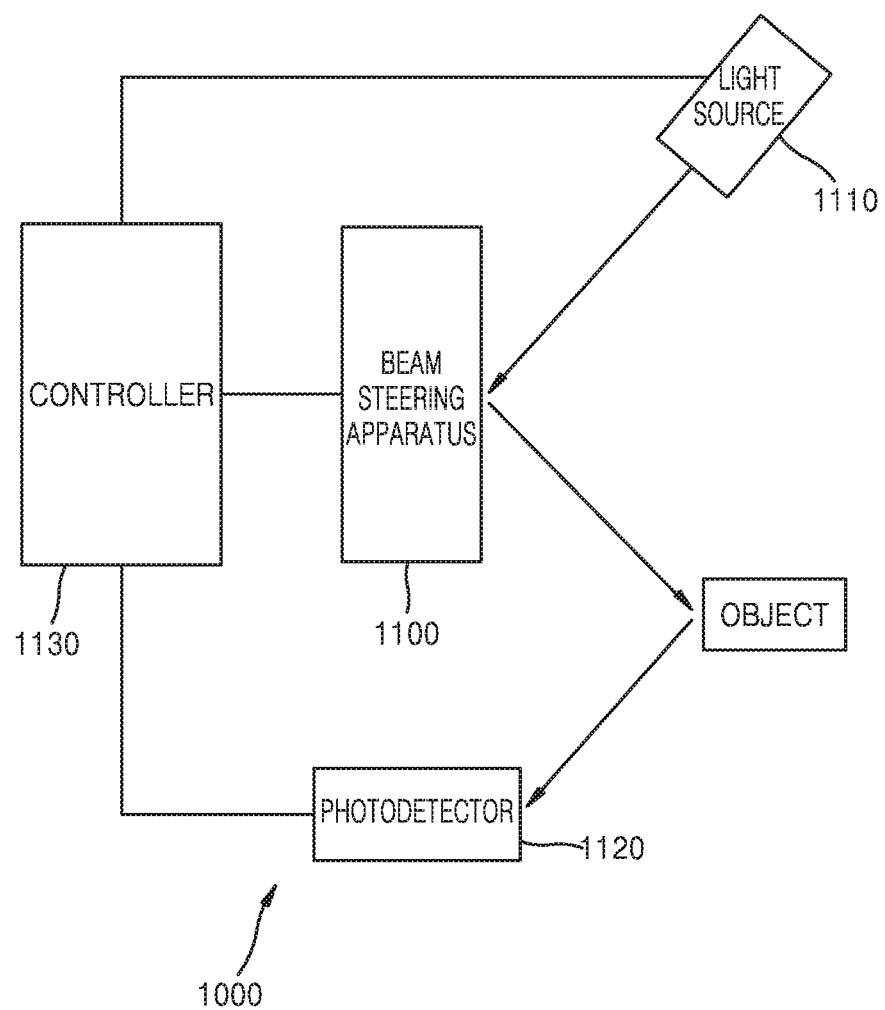
FIG. 10 is a diagram showing a system including a beam steering apparatus according to an example embodiment.

For example, FIG. 10 is a block diagram showing a configuration of a system 1000 according to an example embodiment.

Referring to FIG. 10, the system 1000 according to an example embodiment may include a light source 1110 that radiates light, a beam steering apparatus 1100 for controlling a traveling direction of light incident from the light source 1110, a photodetector 1120 for sensing light emitted from the beam steering apparatus 1100 and reflected from an object, and a controller 1130 including at least one processor for controlling the beam steering apparatus 1100.

The light source 1110 may include, for example, a light source that emits visible light or a laser diode (LD) or light emitting diode (LED) that emits light in the near-infrared ray band in a range of about 800 nm to about 1500 nm.

The beam steering apparatus 1100 may include the beam steering apparatuses according to example embodiments described with reference to FIGS. 1 to 9. The beam steering apparatus 1100 may control a travelling direction of a light beam by modulating a phase of each pixel by heat. The beam steering apparatus 1100 may scan light with a wide viewing angle.

The controller 1130 may control operations of the beam steering apparatus 1100, the light source 1110, and the photodetector 1120. For example, the controller 1130 may control on/off operations of the light source 1110 and the photodetector 1120 and a beam scanning operation of the beam steering apparatus 1100. In addition, the controller 1130 may calculate information about an object based on a measurement result of the photodetector 1120.

The beam steering apparatus 1100 may periodically radiate light to various bands by using the beam steering apparatus 1100 to obtain information about objects in a plurality of locations.

Figure 11:
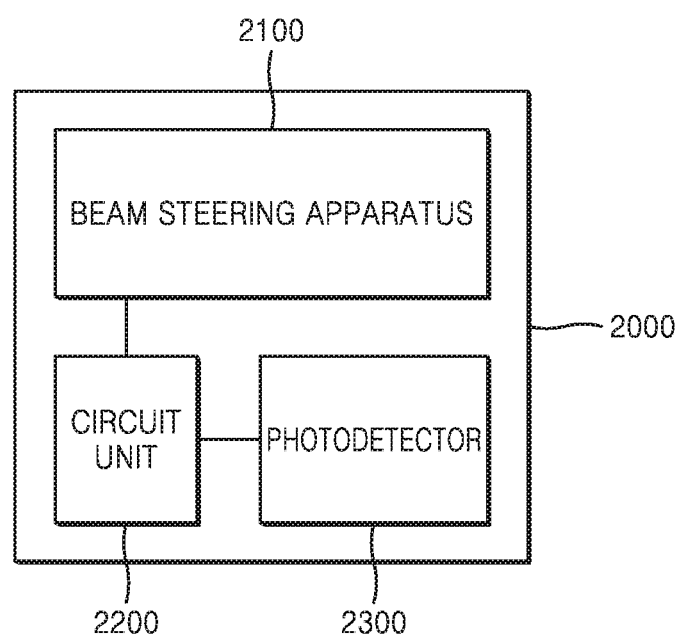
FIG. 11 is a diagram showing a system including a beam steering apparatus according to another example embodiment.

As shown in FIG. 11, a system 2000 may include a beam steering apparatus 2100 and a photodetector 2300 for detecting light, a travelling direction of which is controlled by the beam steering apparatus 2100, radiated to an object and reflected by the object. The system 2000 may further include a circuit unit 2200 connected to at least one of the beam steering apparatus 2100 and the photodetector 2300. The circuit unit 2200 may include a computing unit including at least one processor for acquiring and computing data, and may further include a driving pixel unit and a controller. In addition, the circuit unit 2200 may further include a power supply unit and a memory.

In FIG. 11, although it is depicted a case that the system 2000 includes the beam steering apparatus 2100 and the photodetector 2300 in one apparatus, the beam steering apparatus 2100 and the photodetector 2300 may not be provided as one apparatus, but may be each provided by an additional separate apparatus. In addition, the circuit unit 2200 may not be connected to the beam steering apparatus 2100 or the photodetector 2300 by wire, but may be connected thereto by wireless communication. Besides the above, the configuration of the system 2000 of FIG. 11 may be variously changed.

The beam steering apparatus according to an example embodiment described above may be applied to various systems. As an example, the beam steering apparatus may be applied to a LiDAR device. The LiDAR device may be a device of a phase-shift method or a time-of-flight (TOF) method. The LiDAR device may be applied to autonomous cars, flying objects, such as drones, mobile devices, small walking means (e.g., bicycles, motorcycles, strollers, boards, etc.), robots, human/animal assistances (e.g., canes, helmets, ornaments, clothing, watches, bags, etc.), Internet of Things (IoT) devices/systems, security devices/systems, etc.

Figure 12:
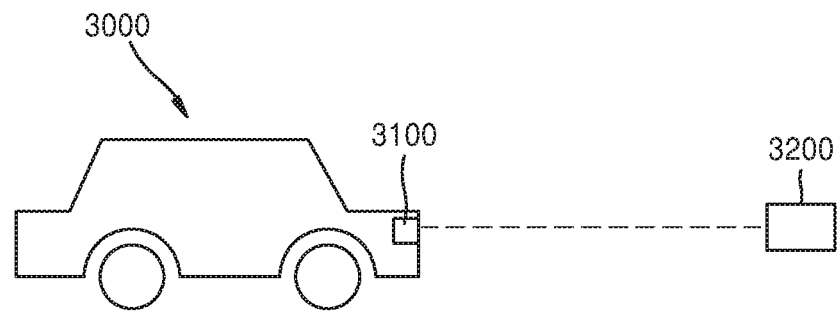
FIG. 12 is a lateral view of a beam steering apparatus according to an example embodiment applied to a LiDAR device for a vehicle.
Figure 13:
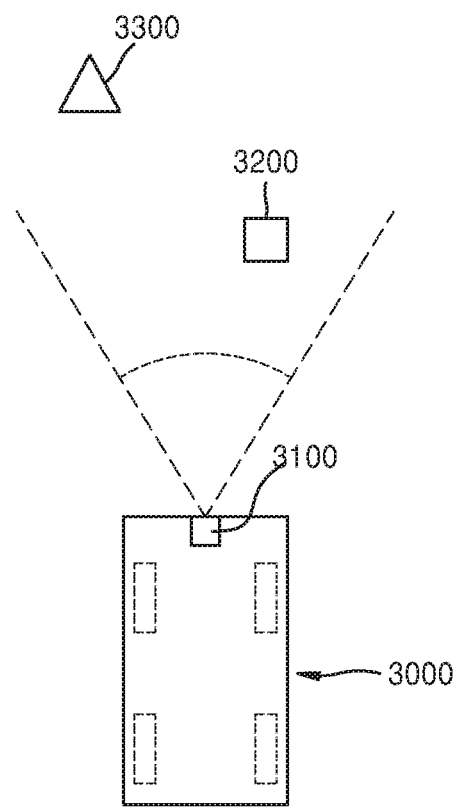
FIG. 13 is a plan view of a beam steering apparatus according to an example embodiment applied to a LiDAR device for a vehicle.

FIGS. 12 and 13 are conceptual diagrams illustrating a case in which a LiDAR device including a beam steering apparatus according to an example embodiment is applied to a vehicle. FIG. 12 is a view seen from a side, and FIG. 13 is a view seen from above.

Referring to FIG. 12, a LiDAR device 3100 may be applied to a vehicle 3000, and information about an object 3200 may be obtained by using the LiDAR device 3100. The vehicle 3000 may have an autonomous driving function. Using the LiDAR device 3100, an object or a person, that is, an object 3200 in a direction the vehicle 3000 moves, may be detected. Also, a distance to the object 3200 may be measured by using information, such as a time difference between a transmission signal and a detection signal. In addition, as illustrated in FIG. 13, information about the object 3200, which is relatively near, and an object 3300, which is relatively far, within a scan range may be acquired.

The beam steering apparatus according to various example embodiments may be applied to various systems other than the LiDAR device. For example, when the beam steering apparatus according to various example embodiments is used, 3D information of a space and an object may be acquired through scanning, and thus, the beam steering apparatus may be applied to a 3D image acquisition device or a 3D camera. In addition, the beam steering apparatus may be applied to a holographic display device and a structured light generating device. In addition, the beam steering apparatus may be applied to various optical devices, such as a hologram generating device, a light coupling device, a variable focus lens, a depth sensor, etc. Also, the beam steering apparatus may be applied to various fields in which a meta surface or a meta structure is used. Besides the above, a light modulator and a beam steering apparatus according to an example embodiment may be applied to various optical and electronic devices for various uses.

In the beam steering apparatus according to an example embodiment, a light modulator and a pixel of a driving pixel unit may be readily connected to each other by improving a wiring structure therebetween. Even when sizes of a light modulator and a pixel of a driving pixel unit are different from each other, the light modulator and the pixel may be freely electrically connected. Accordingly, the sizes of the light modulator and the driving pixel unit may be freely selected.

The system according to an example embodiment may be applied to a 3D sensor or a 3D camera by using a beam steering apparatus.

The example embodiments described above are merely illustrative, and therefore, it will be understood by those skilled in the art that various changes in form and details may be made therein. Accordingly, the scope of the present disclosure is defined not by the detailed description but by the appended claims.

It should be understood that example embodiments described herein should be considered in a descriptive sense only and not for purposes of limitation. Descriptions of features or aspects within each example embodiment should typically be considered as available for other similar features or aspects in other embodiments.

While example embodiments have been described with reference to the figures, it will be understood by those of ordinary skill in the art that various changes in form and details may be made therein without departing from the spirit and scope as defined by the following claims.

What is claimed is:

1. A beam steering apparatus comprising:
a driving pixel unit comprising a plurality of driving pixels that are respectively configured to supply a voltage or a current;
a light modulator comprising a plurality of pixels corresponding to the plurality of driving pixels, each pixel of the plurality of pixels being configured to modulate incident light; and
a wiring layer comprising a wiring structure configured to electrically connect the plurality of driving pixels to the plurality of pixels,
wherein the wiring structure comprises a first conductive wire connected to the plurality of driving pixels, a second conductive wire connected to the plurality of pixels, and at least one third conductive wire connected between the first conductive wire and the second conductive wire, and
wherein the first conductive wire, the second conductive wire, and the at least one third conductive wire form a step structure.

2. The beam steering apparatus of claim 1, wherein the wiring layer comprises a plurality of layers.

3. The beam steering apparatus of claim 1, wherein a size of each driving pixel of the plurality of driving pixels is different from a size of each pixel of the plurality of pixels.

4. The beam steering apparatus of claim 1, wherein a size of each driving pixel of the plurality of driving pixels is greater than a size of each pixel of the plurality of pixels.

5. The beam steering apparatus of claim 1, wherein the light modulator comprises a distributed Bragg reflector, a grating reflector, and a cavity provided between the distributed Bragg reflector and the grating reflector.

6. The beam steering apparatus of claim 5, wherein the grating reflector comprises silicon (Si).

7. The beam steering apparatus of claim 5, wherein a refractive index of the grating reflector changes based on heat or a voltage applied to the grating reflector.

8. The beam steering apparatus of claim 1, wherein the first conductive wire, the second conductive wire, and the at least one third conductive wire comprise at least one of aluminum (Al), copper (Cu), and tungsten (W).

9. The beam steering apparatus of claim 1, wherein the light modulator comprises a mirror layer, a refractive index conversion layer, and a nano-antenna.

10. The beam steering apparatus of claim 9, wherein the refractive index conversion layer comprises at least one of indium tin oxide (ITO), indium zinc oxide (IZO), AZO, gallium zinc oxide (GZO), and gallium indium zinc oxide.

11. A system comprising:
a light source configured to emit light;
a beam steering apparatus configured to transmit light to an object by controlling a traveling direction of the light emitted from the light source;
a photodetector configured to detect light reflected from the object; and
a controller configured to control the beam steering apparatus, wherein
the beam steering apparatus comprises:
a driving pixel unit comprising a plurality of driving pixels that are respectively configured to supply a voltage or a current;
a light modulator comprising a plurality of pixels corresponding to the plurality of driving pixels, each pixel of the plurality of pixels being configured to modulate incident light; and a wiring layer comprising a wiring structure that electrically connects the plurality of driving pixels and the plurality of pixels, wherein the wiring structure comprises a first conductive wire connected to the plurality of driving pixels, a second conductive wire connected to the plurality of pixels, and at least one third conductive wire connected between the first conductive wire and the second conductive wire, and wherein the first conductive wire, the second conductive wire, and the at least one third conductive wire form a step structure.

12. The system of claim 11, wherein the wiring layer comprises a plurality of layers.

13. The system of claim 11, wherein a size of each driving pixel of the plurality of driving pixels is different from a size of each pixel of the plurality of pixels.

14. The system of claim 11, wherein a size of each driving pixel of the plurality of driving pixels is greater than a size of each pixel of the plurality of pixels.

15. The system of claim 11, wherein the light modulator comprises a distributed Bragg reflector, a grating reflector, and a cavity provided between the distributed Bragg reflector and the grating reflector.

16. The system of claim 15, wherein the grating reflector comprises silicon (Si).

17. The system of claim 15, wherein a refractive index of the grating reflector changes based on heat or a voltage being applied to the grating reflector.

18. The system of claim 11, wherein the first conductive wire, the second conductive wire, and the at least one third conductive wire comprise at least one of aluminum (Al), copper (Cu), and tungsten (W).

19. The system of claim 11, wherein the light modulator comprises a mirror layer, a refractive index conversion layer, and a nano-antenna.

20. The system of claim 19, wherein the refractive index conversion layer comprises at least one of indium tin oxide (ITO), indium zinc oxide (IZO), AZO, gallium zinc oxide (GZO), and gallium indium zinc oxide.

* * * * *